US006808863B2

(12) United States Patent
Kita

(10) Patent No.: US 6,808,863 B2
(45) Date of Patent: Oct. 26, 2004

(54) HEAT-SENSITIVE LITHOGRAPHIC PRINTING PLATE PRECURSOR

(75) Inventor: Nobuyuki Kita, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 114 days.

(21) Appl. No.: 09/739,006

(22) Filed: Dec. 19, 2000

(65) Prior Publication Data

US 2001/0008740 A1 Jul. 19, 2001

(30) Foreign Application Priority Data

Dec. 12, 1999 (JP) ........................................ P.11-364312

(51) Int. Cl.[7] .................................................... G03F 7/11

(52) U.S. Cl. ............................... 430/273.1; 430/281.1; 430/286.1; 101/453

(58) Field of Search ........................... 430/286.1, 270.1, 430/271.1, 273.1, 281.1, 302, 944, 945; 101/453, 463.1

(56) References Cited

U.S. PATENT DOCUMENTS

| | | | | | |
|---|---|---|---|---|---|
| 5,939,237 | A | * | 8/1999 | Gardner et al. | 430/273.1 |
| 5,962,188 | A | * | 10/1999 | DeBoer et al. | 430/273.1 |
| 5,985,515 | A | * | 11/1999 | Van Rompuy et al. | 430/272.1 |
| 6,068,965 | A | * | 5/2000 | Hauquier et al. | 430/302 |
| 6,090,524 | A | * | 7/2000 | Deboer et al. | 430/272.1 |
| 6,110,645 | A | * | 8/2000 | DeBoer et al. | 430/302 |
| 6,165,685 | A | * | 12/2000 | Maerz et al. | 430/273.1 |
| 6,210,857 | B1 | * | 4/2001 | Vermeersch et al. | 430/270.1 |
| 6,312,866 | B1 | * | 11/2001 | Obuchowicz et al. | 430/270.1 |
| 6,387,595 | B1 | * | 5/2002 | Teng | 430/302 |
| 6,399,276 | B1 | * | 6/2002 | Van Damme et al. | 430/273.1 |
| 6,468,717 | B2 | * | 10/2002 | Kita et al. | 430/278.1 |
| 6,500,599 | B1 | * | 12/2002 | Inno et al. | 430/273.1 |
| 2001/0024766 | A1 | * | 9/2001 | Kita et al. | 430/272.1 |
| 2001/0033992 | A1 | * | 10/2001 | Kita | 430/273.1 |
| 2002/0068239 | A1 | * | 6/2002 | Van Damme et al. | 430/273.1 |

FOREIGN PATENT DOCUMENTS

| | | |
|---|---|---|
| EP | 0960729 A1 | 12/1999 |
| GB | 1245924 | 9/1971 |
| WO | WO 94/18005 | 8/1994 |

* cited by examiner

*Primary Examiner*—Barbara Gilliam
(74) *Attorney, Agent, or Firm*—Burns, Doane, Swecker & Mathis, L.L.P.

(57) ABSTRACT

A heat-sensitive lithographic printing plate precursor having on a support (1) an ink-receptive layer comprising an oleophilic organic high molecular compound and (2) a water-receptive layer easily allowing removal by a fountain solution or a printing ink when heated, which are arranged in this order; with the water-receptive layer being a layer formed using a coating solution comprising a solvent capable of dissolving the organic high molecular compound of the ink-receptive layer in a proportion of 1 to 40 weight % of the total solvents in the coating solution.

18 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor which requires no development-processing and can ensure a long press life and high stain resistance. More specifically, the present invention relates to a lithographic printing plate precursor which enables recording of images by scanning exposure to infrared laser beams based on digital signals and, after the images are recorded therein, can be mounted in a printing machine (i.e., a printing press) without undergoing development-processing and can then be subjected to printing operations.

BACKGROUND OF THE INVENTION

Various methods have been proposed concerning a lithographic printing plate precursor of the kind which enables image formation by heat and can be mounted in a printing machine without development-processing after the image formation. One promising method among them is a method of utilizing an ablation phenomenon, specifically which comprises exposing a printing plate precursor containing a compound capable of converting light to heat by means of a high-output solid-state laser, e.g., a semiconductor laser or a YAG laser, to make the exposed area evolve heat by the compound capable of converting light to heat, thereby causing decomposition and evaporation, namely ablation, in the exposed area.

In other words, a water-receptive layer is provided on a substrate having an oleophilic ink-receptive layer and the water-receptive layer is removed by ablation.

In WO94/18005 is disclosed the printing plate made by providing a cross-linked water-receptive layer on an oleophilic laser beam absorbing layer and subjecting the water-receptive layer to ablation-processing. This water-receptive layer comprises polyvinyl alcohol cross-linked with hydrolysis products of tetraethoxysilane and titanium dioxide grains, and thereby achieves an improvement in strength of the water-receptive layer. Although such a technique enables an increase in impression capacity, it fails in ensuring sufficient stain resistance because the polyvinyl alcohol, which contains hydrocarbon groups and is not so high in water receptivity, comprises 48 weight % of the water-receptive layer. Therefore, further improvement is required for such a water-receptive layer.

In WO98/40212, WO99/19143 and WO99/19144 were disclosed the lithographic printing plate precursors which each comprise on an ink-receptive layer-coated substrate a water-receptive layer containing as a main component a colloid, such as silica, cross-linked with a cross-linking agent, such as aminopropyltriethoxysilane, and can be mounted in a printing machine without development-processing. Such a water-receptive layer achieves the largest possible reduction in content of hydrocarbon groups to ensure an improved stain resistance, and increases its impression capacity by cross-linking the colloid with the cross-linking agent as mentioned above. However, the impression capacity of such a printing plate is several thousand sheets, so it is still insufficient.

The ablation-utilized digital direct processing-free lithographic printing plates as disclosed in the publications described above have great advantages of streamlining processes for printing and reducing waste materials since they enable direct plate-making from block copies without the need for films and the printing plates made can be mounted in a printing machine as they stand and subjected directly to printing operations. However, owing to technical difficulties in making development-processing unnecessary, either of the basic characteristics required for a printing plate, stain resistance or impression capacity, tends to be impaired, so that techniques satisfying both requirements have not yet been developed.

SUMMARY OF THE INVENTION

Therefore, an object of the present invention is to solve the aforementioned problems. More specifically, the object of the present invention is to provide a heat-sensitive lithographic printing plate precursor capable of being mounted in a printing machine after exposure and subjected to printing operations as it is without undergoing development-processing, and besides, ensuring both a long press life and high stain resistance.

As a result of our intensive studies, it has been found that the object mentioned above can be attained by developing a specially formulated coating solution for an excellent water-receptive layer, thereby achieving the present invention.

Specifically, embodiments and preferred embodiments of the present invention are described below.

1. A heat-sensitive lithographic printing plate precursor having on a support (1) an ink-receptive layer comprising an oleophilic organic high molecular compound and (2) a water-receptive layer easily allowing removal by a fountain solution or a printing ink when heated, which are arranged in this order: with the water-receptive layer being a layer formed using a coating solution comprising a solvent capable of dissolving the organic high molecular compound of the ink-receptive layer in a proportion of 1 to 40 weight % of the total solvents in the coating solution.

2. The heat-sensitive lithographic printing plate precursor as described in Embodiment 1, wherein the water-receptive layer comprises a hydrophilic resin and a colloid of oxide or hydroxide of at least one element selected from the group consisting of beryllium, magnesium, aluminum, silicon, titanium, boron, germanium, tin, zirconium, iron, vanadium, antimony and transition metals.

3. The heat-sensitive lithographic printing plate precursor as described in Embodiment 2, wherein the hydrophilic resin is contained in a proportion of 0.1 to 30 weight % to the total solid components in the water-receptive layer.

4. The heat-sensitive lithographic printing plate precursor as described in Embodiment 2, wherein the hydrophilic resin is a hydroxyalkyl acrylate homo- or copolymer or a hydroxyalkyl methacrylate homo- or copolymer.

DETAILED DESCRIPTION OF THE INVENTION

Practical embodiments of the present invention are illustrated below in detail.

Supports (including a substrate) usable in the present invention are dimensionally stable plate (or sheet) materials.

Examples of such materials include paper, papers laminated with oleophilic plastics (such as polyethylene, polypropylene and polystyrene), metallic plates (or sheets) (such as aluminum, zinc, copper, nickel and stainless steel plates (or sheets)) ,plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films), and papers and plastic films on which the metals as described above are laminated or vapor-deposited.

Of those materials, polyethylene terephthalate film, polycarbonate film, aluminum plate (or sheet), steel plate (or sheet), and oleophilic plastic film-laminated aluminum or steel plate (or sheet) are preferred.

The aluminum plate (or sheet) used for the present invention can be chosen properly from aluminum plates (or sheets) made of well-known materials.

Before using an aluminum plate (or sheet), it is desirable for the aluminum plate (or sheet) to undergo surface treatment, such as graining, anodic oxidation, silicate treatment or/and undercoating treatment, if needed. By such a surface treatment, the adhesion between the support and the ink-receptive layer containing an organic high molecular compound can be increased. Those surface treatments can be effected using well-known surface treatment techniques for aluminum plates (or sheets).

The thickness of a support used in the present invention is from about 0.05 mm to about 0.6 mm, preferably from 0.1 mm to 0.4 mm, particularly preferably from 0.15 mm to 0.3 mm.

The oleophilic ink-receptive layer of the present invention provided on the support comprises an oleophilic organic high molecular compound soluble in solvents, having a film-forming ability.

Suitable examples of the organic high molecular compound which are useful in the present invention include polyester, polyurethane, polyurea, polyimide, polysiloxane, polycarbonate, phenoxy resin, epoxy resin, phenol-formaldehyde resin, alkylphenol-formaldehyde resin, polyvinyl acetal, acrylic resin and copolymers thereof, polyvinyl phenol, polyvinyl halogenated phenols, methacrylic resin and copolymers thereof, acrylamide copolymers, methacrylamide copolymers, polyvinyl formal, polyamide, polyvinyl butyral, polystyrene, cellulose ester resins, polyvinyl chloride and polyvinylidene chloride.

Of these compounds, the resins having hydroxyl groups, carboxyl groups, sulfonamido groups or trialkoxysilyl groups in their side chains are preferred because they have excellent adhesiveness to the support and a water-receptive layer as the upper layer and, in some cases, can be easily cured with a cross-linking agent. In addition, acrylonitrile copolymers, polyurethane and the products obtained by curing copolymers containing sulfonamido groups or hydroxyl groups in their side chains with diazo resins under exposure to light are favorable, too.

Further, novolak resins and resol resins as the condensation products of phenolic compounds and formaldehyde, wherein the phenolic compounds include phenol, cresol, phenol-cresol (m-cresol, p-cresol, m-cresol/p-cresol mixture) mixture, phenol-modified xylene, tert-butylphenol, octylphenol, resorcinol, pyrogallol, catechol, chlorophenol (m-chloro, p-chloro), bromophenol (m-bromo, p-bromo), salicylic acid and phloroglucinol, and resins produced by condensation of phenolic compounds as described above and acetone are useful.

Other suitable examples of a high molecular compound used in the present invention include copolymers having as their constitutional units two or more monomers selected from the following items (1) to (12) and usually having a molecular weight of 10,000 to 200,000:

(1) aromatic hydroxyl group-containing acrylamides, methacrylamides, acrylates and methacrylates, and hydroxystyrenes, with examples including N-(4-hydroxyphenyl)acrylamide, N-(4-hydroxyphenyl) methacryl-amide, o-, m- and p-hydroxystyrenes, and o-, m- and p-hydroxyphenyl acrylates and methacrylates;

(2) aliphatic hydroxyl group-containing acrylates and methacrylates, such as 2-hydroxyethyl acrylate and 2-hydroxyethyl methacrylate;

(3) (substituted) acrylates, such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(4) (substituted) methacrylates, such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate;

(5) acrylamides and methacrylamides, such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(6) vinyl ethers, such as ethyl vinyl ether, 2-chloroethyl vinyl ether, hydroxyethyl vinyl ether, propyl vinyl ether, butyl vinyl ether, octyl vinyl ether and phenyl vinyl ether;

(7) vinyl esters, such as vinyl acetate, vinyl chloroacetate, vinyl butyrate and vinyl benzoate;

(8) styrenes, such as styrene, methylstyrene and chloromethylstyrene;

(9) vinyl ketones, such as methyl vinyl ketone, ethyl vinyl ketone, propyl vinyl ketone and phenyl vinyl ketone;

(10) olefins, such as ethylene, propylene, isobutylene, butadiene and isoprene;

(11) N-vinylpyrrolidone, N-vinylcarbazole, 4-vinylpyridine, acrylonitrile and methacrylonitrile; and

(12) unsaturated sulfonamides, including acrylamides such as N-(o-aminosulfonylphenyl)acrylamide, N-(m-amino-sulfonylphenyl) acrylamide, N-(p-aminosulfonylphenyl)acryl-amide, N-[1-(3-aminosulfonyl) naphthyl]acrylamide and N-(2-aminosulfonylethyl)acrylamide, methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl)methacrylamide, acrylates such as o-aminosulfonylphenyl acrylate, m-aminosulfonylphenyl acrylate, p-aminosulfonylphenyl acrylate and 1-(3-aminosulfonyl)naphthyl acrylate, and methacrylates such as o-aminosulfonylphenyl methacrylate, m-aminosulfonylphenyl methacrylate, p-aminosulfonylphenyl methacrylate and 1-(3-aminosulfonylphenyl-naphthyl) methacrylate.

The ink-receptive layer can be formed by dissolving an organic high molecular compound as described above in an appropriate solvent, coating the solution on a support, and then drying the coating solution. Therein, though the organic high molecular compound alone may be dissolved in the solvent, other ingredients including a cross-linking agent, an adhesion aid, a coloring agent, inorganic or organic fine particles, a coating surface improving agent and a plasticizer can be added to the solution, if needed.

To the ink-receptive layer, a compound capable of converting light to heat may be further added for increasing the sensitivity and a thermally coloring (color-forming) or discoloring agents for forming printout images after exposure to light may be added.

Examples of a cross-linking agent usable for cross-linking of organic high molecular compounds as described above include diazo resin, aromatic azide compounds, epoxy resin, isocyanate compounds, blocked isocyanate compounds, initial hydrolysis condensates of tetraalkoxysilanes, glyoxal, aldehyde compounds and methylol compounds.

As the adhesion aid, the diazo resin is used to advantage because of its excellent adhesiveness to both support (including substrate) and water-receptive layer, and besides, silane coupling agents, isocyanate compounds and titanium type coupling agents are also useful.

Examples of a coloring agent usable in the ink-receptive layer include conventional dyes and pigments, especially such as Rhodamine 6G chloride, Rhodarnine B chloride, Crystal Violet, Malachite Green oxalate, oxazine-4 perchiorate, quinizarin, 2-(α-naphthyl)-5-phenyloxazole and coumarin-4. Examples of other dyes which are also usable include triphenylmethane dyes, diphenylmethane dyes, oxazine dyes, xanthene dyes, iminonaphthoquinone dyes, azomethine dyes, anthraquinone dyes and the dyes disclosed in JP-A-62-293247 (the term P-A as used herein means an nexamined published Japanese Patent application and JP-A-9-179290. The representative examples of these dyes include Oil Yellow #101, Oil Yellow #103, Oil Pink #312, Oil Green BG, Oil Blue DOS, Oil Blue #603, Oil Black BY, Oil Black BS, Oil Black T-505 (products of Orient Chemical Industry Co., Ltd.), Victoria Pure Blue, Crystal Violet (C.I.42555), Methyl Violet (C.I.42535), Ethyl Violet, Methylene Blue (C.I.52015), Patent Pure Blue (a product of Sumitomo Mikuni Chemical Co., Ltd.), Brilliant Blue, Methyl Green, Erythricine B, Basic Fuchaine, m-cresol purple, Auramine, 4-p-diethylaminophenyliminonaphthoquinone and cyano-p-diethylaminophenylacetanilide.

When the dyes as described above are added to the ink-receptive layer, the proportion thereof is generally from about 0.02 to about 10 weight %, preferably from about 0.1 to about 5 weight %, to the total solid components in the ink-receptive layer.

Further, fluorine-based surfactants and silicone-based surfactants well-known as coating surface improving agents can be added. More specifically, surfactants containing perfluoroalkyl groups or dimethylsiloxane groups are useful for adjusting the coating surface.

Examples of inorganic or organic fine powder usable in the present invention include colloidal silica and colloidal aluminum wherein the particles are from 10 to 100 nm in size, and inactive particles having sizes larger than those colloids, such as silica particles, silica particles on which the surface has a hydrophobic property, alumina particles, titanium dioxide particles, other heavy metal particles, clay and talc. The addition of these inorganic or organic fine powders to the ink-receptive layer produces an effect of improving the adhesion to the water-receptive layer formed as the upper layer and ensuring an increased impression capacity for the resulting printing plate. The proportion of these fine powders added is 80 weight % or less, preferably 40 weight % or less, to the total weight of the ink-receptive layer.

Furthermore, plasticizers may be added to the ink-receptive layer of the present invention for imparting flexibility thereto, if needed. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic or methacrylic acid.

In addition, it is preferred a coloring (i.e., a color-forming) or discoloring compound to the ink-receptive layer of the present invention for the purpose of clearly distinguishing between image and non-image areas at the time of exposure. For instance, the combination of a thermoacid generator, such as a diazo compound or diphenyl iodonium salt, and a leuco dye (e.g., leuco Malachite Green, leuco Crystal Violet, Crystal Violet lactone) or a dye changing its color by a change in pH (e.g., Ethyl Violet, Victoria Pure Blue BOH) can be used for such a purpose. Further, the combination of an acidic binder and a dye capable of forming a color in the presence of acid as disclosed in EP 897,134 is effective. In this case, the bond between dye molecules in an associated state are broken by heating to form a lactone body, and thereby a conversion from colored to colorless compound is caused.

The proportion of coloring or discoloring compound added is 10 weight % or less, preferably 5 weight % or less, to the total solid components in the ink-receptive layer.

Examples of a solvent used for coating the ink-receptive layer include alcohols (such as methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether), ethers (such as tetrahydrofuran, ethylene glycol dimethyl ether, propylene glycol dimethyl ether and tetrahydropyran), ketones (such as acetone, methyl ethyl ketone and acetyl acetone), esters (such as methyl acetate and ethylene glycol monomethylmonoacetate), amides (such as formamide, N-methylformamide, pyrrolidone and N-methylpyrrolidone), γ-butyrolactone, methyl lactate and ethyl lactate. These solvents may be used alone or as a mixture of two or more thereof. In preparing a coating solution for the ink-receptive layer, the concentration of ingredients (total solid components including additives) in the solvent is preferably controlled to the range of 1 to 50 weight %. The coating film can be formed from not only the coating solution using an organic solvent as described above but also an aqueous emulsion. The suitable concentration of ingredients in the aqueous emulsion is from 5 to 50 weight %.

The ink-receptive layer of the present invention is not particularly restricted in the thickness which it has after having been coated and dried, but the thickness of at least 0.1 μm will serve the purpose of the present invention. In the case of providing the ink-receptive layer on a metal plate (or sheet), however, it is desirable for the layer to have a thickness of at least 0.5 μm because the layer functions also as a heat insulating layer. When the ink-receptive layer is too thin, the heat generated therein dissipates into the metal plate (or sheet); as a result, the sensitivity is lowered. In the case where the metal plate (or sheet) has water-receptivity also, the ink-receptive layer cannot ensure a long impression capacity when its thickness is too thin, because high abrasion resistance is required for the ink-receptive layer. In the case of using an oleophilic plastic film as a support, on the other hand, it is sufficient for the ink-receptive layer to function as an adhesive layer to the upper layer. So, the thickness of ink-receptive layer may be thinner than that in the case of using a metal plate (or sheet). Specifically, the suitable thickness in the case of using an oleophilic plastic film is at least 0.05 μm.

The water-receptive layer used in the present invention can be formed by coating a solution containing a hydrophilic resin and a colloidal oxide or hydroxide of at least one element selected from the group consisting of beryllium, magnesium, aluminum, silicon, titanium, boron, germanium, tin, zirconium, iron, vanadium, antimony and transition metals.

Of those elements constituting colloidal oxides or hydroxides usable in the present invention, aluminum, silicon, titanium and zirconium are preferred.

In the case of silica, the colloidal particles suitable for the present invention are preferably particles having a spherical form and having a particle size of from 5 nm to 100 nm. Further, it is possible to use a colloid wherein spherical particles having a particle size of 10 nm to 50 nm are ranged in the pearl necklace form with a length of 50 to 400 nm. In addition, colloids wherein particles are formed in the feather-like form of 100 nm×10 nm in size, such as aluminum colloid, are also effective.

These colloids can be prepared using well-known various methods, such as hydrolyses of halides or alkoxy compounds of the elements described above and condensation of hydroxides. Also, those colloidal dispersions are commercially available, e.g., as products of Nissan Chemicals Industries Ltd.

Hydrophilic resins suitable for the water-receptive layer of the present invention are resins having hydrophilic groups (e.g., hydroxyl, carboxyl, hydroxyethyl, hydroxypropyl, amino, aminoethyl, aminopropyl or carboxymethyl groups).

Examples of such hydrophilic resins include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acid and salts thereof, polymethacrylic acid and salts thereof, hydroxyethyl methacrylate homopolymer and copolymers, hydroxyethyl acrylate homopolymer and copolymers, hydroxypropyl methacrylate homopolymer and copolymers, hydroxypropyl acrylate homopolymer and copolymers, hydroxybutyl methacrylate homopolymer and copolymers, hydroxybutyl acrylate homopolymer and copolymers, polyethylene glycol, polypropylene glycol, polyvinyl alcohol, hydrolyzed polyvinyl acetate having a hydrolysis degree of at least 60 weight %, preferably at least 80 weight %, polyvinyl formal, polyvinyl butyral, polyvinyl pyrrolidone, acrylamide homopolymer and copolymers, methacrylamide homopolymer and copolymers, and N-methylolacrylamide homopolymer and copolymers.

The hydrophilic resins particularly preferred are polymers containing hydroxyl groups, such as hydroxyethyl acrylate or hydroxyethyl methacrylate homopolymer and copolymers.

The appropriate proportion of hydrophilic resins added is from 0.1 to 30 weight %, preferably from 5 to 20 weight %, to the total solid components in the water-receptive layer. When the proportion is below the foregoing range, the printing plate obtained has insufficient impression capacity; while, when it is beyond the foregoing range, the printing plate obtained tends to generate stain.

In addition to the aforementioned colloids hydrophulic resins and compound capable of converting light to heat, cross-linking agents capable of accelerating cross-linking of colloids may be added to the water-receptive layer of the present invention. Suitable examples of such a cross-linking agent for colloids include initial hydrolysis and condensation products of tetraalkoxysilanes, trialkoxysilylpropyl-N,N,N-trialkylammonium halides and aminopropyltrialkoxysilanes. The appropriate proportion of the cross-linking agent added is 5 weight % or less to the total solid components in the water-receptive layer.

Further, cross-linking agents for hydrophilic resins may be added to the water-receptive layer of the present invention for the purpose of ensuring an increased impression capacity for the resulting printing plate. Examples of such a cross-linking for hydrophilic resins include formaldehyde, glyoxal, polyisocyanate, initial hydrolysis and condensation products of tetraalkoxysilanes, dimethylol urea and hexamethylolmelamine.

The water-receptive layer containing the ingredients as described above is formed by dispersing or dissolving the ingredients in a single or mixed solvent to prepare a coating composition and then coating the composition. The main solvent of the coating composition for the water-receptive layer is water and alcohol having a low boiling point, such as methanol, ethanol or propanol, or a mixture thereof.

Adding a certain solvent, in which the oleophilic high molecular compound of the ink-receptive layer can be dissolved, to such a main solvent is a gist of the present invention. Specifically, the solvents suitable for addition to the main solvent are good solvents for organic high molecular compounds. The good solvents vary from one high molecular compound to another, so it is difficult to specify what solvents are good. In general, however, the good solvents are those selected from among alcohols (such as ethylene glycol monomethyl ether, propylene glycol monomethyl ether and ethylene glycol monoethyl ether), ethers (such as tetrahydrofuran, ethylene glycol dimethyl ether, propylene glycol dimethyl ether and tetrahydropyran), ketones (such as acetone, methyl ethyl ketone, methyl isobutyl ketone, acetyl acetone and cyclohexanone), esters (such as methyl acetate, ethyl acetate, isobutyl acetate and ethylene glycol monomethylmonoacetate), amides (such as formamide, N-methylformamide, pyrrolidone and N-methylpyrrolidone), γ-butyrolactone, methyl lactate or ethyl lactate.

In accordance with the present invention, a good solvent for an oleophilic organic high molecular compound is added to a coating solution for a water-receptive layer, and thereby improvement in impression capacity can be achieved. As a reason for this improvement, it can be presumed that the ink-receptive layer and the water-receptive layer are merged together at the interface between them by virtue of the solvent capable of dissolving the organic high molecular compound, or the water-receptive layer penetrates into the vicinity of the interface of ink-receptive layer swollen by the solvent capable of dissolving the organic high molecular compound, thereby increasing adhesion between both layers.

The appropriate proportion of the solvent of the present invention, in which the ink-receptive layer can be dissolved, to the total solid components in the coating composition for the water-receptive layer is from 1 to 40 weight %, preferably from 4 to 20 weight %. When the proportion is below the foregoing range, no improvement in impression capacity is produced; while when the proportion is beyond the foregoing range, the ink-receptive layer and the water-receptive layer are mixed to excess at the interface, and thereby printing stain is generated.

To the water-receptive layer of the present invention, well-known fluorine-based surfactants, silicone-based surfactants or polyoxyethylene-based surfactants may further be added for the purpose of improving the coating surface condition.

The suitable thickness of the water-receptive layer of the present invention is from 0.1 to 3 $\mu$m, preferably from 0.5 to 2 $\mu$m. When the water-receptive layer is too thin, the durability thereof is deteriorated, so the resulting printing plate is inferior in impression capacity. When the water-receptive layer is too thick, on the other hand, great energy is required to ablatively peel off the water-receptive layer from the ink-receptive layer, and so the image-drawing with laser beams takes a long time to lower the productivity in plate-making. When the image-drawing is carried out using a commercially available semiconductor laser of general type, the energy of 300 to 400 mJ/cm$^2$ is required for feeling off the water-receptive layer having a thickness of about 0.5 $\mu$m, while the energy of 400 to 500 mJ/cm$^2$ is required for peeling off the water-receptive layer having a thickness of about 1.5 $\mu$m.

In order to prevent the scatter of scum upon ablation and the contamination of the water-receptive layer due to oleophilic ingredients, the heat-sensitive lithographic printing plate precursor of the present invention may have on the water-receptive layer an overcoat layer containing a water-soluble resin as a main component.

The water-soluble overcoat layer used in the present invention can be removed easily under printing, and comprises at least one resin selected from water-soluble high molecular compounds. The water-soluble high molecular compounds usable therein are compounds capable of forming films when coated and dried, with examples including polyvinyl acetate (having a hydrolysis factor of at least 65%) ,polyacrylic acid and alkali metal or amine salts thereof, polyacrylic acid copolymers and alkali metal or amine salts thereof, polymethacrylic acid and alkali metal or amine salts thereof, polymethacrylic acid copolymer and alkali metal or amine salts thereof, polyacrylamide and copolymers thereof, polyhydroxyethyl acrylate, polyvinyl pyrrolidone and copolymers thereof, polyvinyl methyl ether, polyvinyl methyl ether-maleic anhydride copolymer, poly-2-acrylamide-2-methyl-1-propanesulfonic acid and alkali metal or amine salts thereof, poly-2-acrylamide-2-methyl-1-propanesulfonic acid copolymers and alkali metal or amine salts thereof, gum arabic, cellulose derivatives (such as carboxymethyl cellulose, carboxyethyl cellulose and methyl cellulose) and modifieded products thereof, white dextrin, pullulan and enzyme-decomposed etherified dextrin. These resins may be used as a mixture of two or more thereof, if desired.

When the overcoat layer is formed by application of an aqueous coating solution, nonionic surfactants can be added mainly to the aqueous coating solution for the purpose of securing uniformity in the coating. Examples of a nonionic surfactant usable for such a purpose include sorbitan tristearate, sorbitan monopalmitate, sorbitan trioleate, stearic acid monoglyceride, polyoxyethylene nonyl phenyl ether and polyoxyethylene dodecyl ether.

The suitable proportion of such a nonionic surfactant to the total solid components in the overcoat layer is from 0.05 to 5 weight %, preferably from 1 to 3 weight %.

The suitable thickness of the overcoat layer used in the present invention is from 0.05 to 4.0 $\mu$m, preferably from 0.1 to 1.0 $\mu$m. When the thickness is too thick, it takes much time to remove the overcoat layer at the time of printing and the water-soluble resin eluted in a large amount has an adverse effect on a fountain solution to cause troubles during the printing operation, such as roller strip and no inking on the image areas. When the overcoat layer is too thin, on the other hand, the film quality is lost in some cases.

To at least one among the water-receptive, ink-receptive and overcoat layers of the present invention, it is advantageous to add a compound capable of converting light to heat having the capability of absorbing infrared radiation and evolving heat.

As the compound capable of converting light to heat, any of substances capable of absorbing light of wavelengths of not shorter than 700 nm may be used, and examples thereof include various pigments and dyes. Specifically, pigments which can be utilized herein include commercially available pigments and pigments described in *Color Index* (*C.I.*) *Binran* (*Color Index* (*C.I.*) *Handbook*), compiled by Nihon Ganryo Gijutsu Kyokai (1977), *Saishin Ganryo Binran* (*Handhook of Latest Pigments*), compiled by Nihon Ganryo Gijutsu Kyokai (1977), *Saishin Ganryo Oyo Gijutsu* (*Latest Pigment Application Techniques*), published by CMC Publishing Co., Ltd. (1986), and *Insatsu Ink Gijutsu* (*Printing Ink Techniques*), published by CMC Publishing Co., Ltd. (1984).

More specifically, various pigments, such as black pigments, brown pigments, red pigments, pearl pigments, blue pigments, green pigments, fluorescent pigments, metallic powder pigments and polymer-attaching dyes, can be exemplified. Examples of such pigments include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, inorganic pigments and carbon black.

Those pigments may be used without surface treatment, or they may undergo surface treatment before use. Suitable examples of a method of treating the surface of the pigment include a method of coating the pigment surface with a hydrophilic resin or an oleophilic resin, a method of adhering a surfactant to the pigment surface and a method of attaching a reactive substance (such as silica sol, alumina sol, silane coupling agents, epoxy compounds and isocyanate compounds) to the surface of the pigment. These surface treatment methods are described in *Kinzoku Sekken no Seishitsu to Oyo* (*Properties and Applications of Metal Soap*), Saiwai Shobo Co., Ltd., *Insatsu Ink Gijutsu* (*Printing Ink Techniques*), published by CMC Publishing Co., Ltd. (1984) and *Saishin Ganryo Oyo Gijutsu* (*Latest Pigment Application Techniques*), published by CMC Publishing Co., Ltd. (1986). Of the pigments described above, pigments capable of absorbing infrared radiation are much preferable in having suitability for utilization of infrared laser. As the pigment capable of absorbing infrared radiation, carbon black is preferred in particular.

The pigment advantageously used in the water-receptive layer and the overcoat layer is hydrophilic resin-coated carbon black or silica sol-coated carbon black, because such carbon black is easily dispersed into water-soluble or hydrophilic resins and has no adverse effect on the water receptivity of the layers.

The suitable grain size of pigment is from 0.01 to 1 μm, preferably from 0.01 to 0.5 μm. As a method of dispersing pigments, conventional dispersion techniques for ink or toner production can be employed. Examples of a dispersing apparatus usable therein include an ultrasonic disperser, a sand mill, an attrition mill, a pearl mill, a super mill, a ball mill, an impeller, a disperser, a KD mill, a colloid mill, a dynatron, a three-roll mill and a pressure kneader. Details of dispersion techniques are described in *Saishin Ganryo Oyo Gijutsu* (*Latest Pigment Application Techniques*), published by CMC Publishing Co., Ltd. (1986).

Dyes usable as a compound capable of converting light to heat include commercially available dyes and well-known dyes as described, e.g., in Senryou Binran (Handbook of Dyes), compiled by Yuki Gosei Kagaku Kyokai (1970). As examples of such dyes, azo dyes, metal complex azo dyes, pyrazolone azo dyes, anthraquinone dyes, phthalocyanine dyes, carbonium dyes, quinoneimine dyes, methine dyes and cyanine dyes are exemplified. Of these dyes, infrared absorbing dyes are much preferable in use of lasers emitting infrared radiation.

Examples of dyes capable of absorbing infrared radiation include the cyanine dyes as disclosed in JP-A-58-125246, JP-A-59-84356 and JP-A-60-78787, the methine dyes as disclosed in JP-A-58-173696, JP-A-58-181690 and JP-A-58-194595, the naphthoquinone dyes as disclosed in JP-A-58-112793, JP-A-58-224793, JP-A-59-48187, JP-A-59-73996, JP-A-60-52940 and JP-A-60-63744, the squarylium dyes as disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, and the dyes disclosed in JP-A-10-268512.

In addition, sensitizers capable of absorbing the near infrared radiation disclosed in U.S. Pat. No. 5,156,938 can be suitably used as dyes. Besides the dyes described above, the substituted arylbenzo(thio)pyrylium salts disclosed in U.S. Pat. No. 3,881,924, the trimethinethiapyrylium salts disclosed in JP-A-57-142645 (corresponding to U.S. Pat. No. 4,327,169), the pyrylium compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethinethiopyrylium salts disclosed in U.S. Pat. No. 4,283,475, the pyrylium compounds disclosed in JP-B-5-13514 and JP-B-5-19702 (the term "JP-B" as used herein means an "examined Japanese patent publication"), and Epolight III-178, Epolight III-130 and Epolight III-125 (produced by Epolin Co., Ltd.) can be favorably used.

Of the dyes as described above, the dyes especially suitable for the addition to the water-receptive layer and the overcoat layer are water-soluble dyes, and examples thereof are illustrated below by their respective structural formulae.

(IR-1)

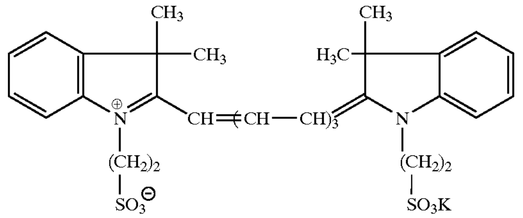

(IR-2)

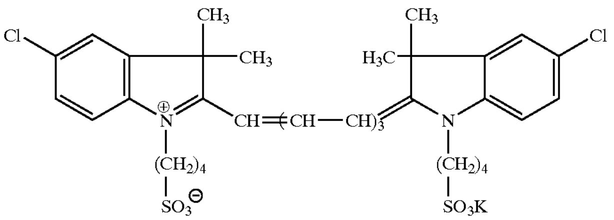

(IR-3)

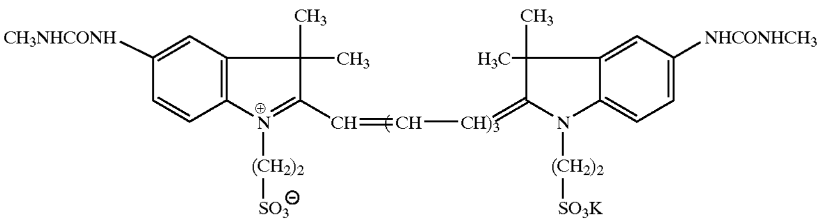

(IR-4)

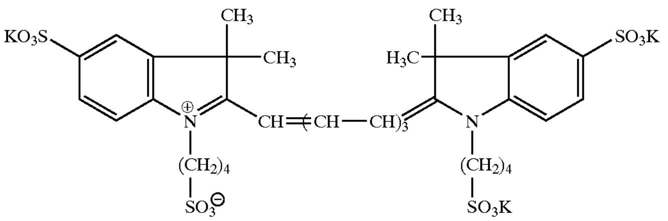

-continued
(IR-5)
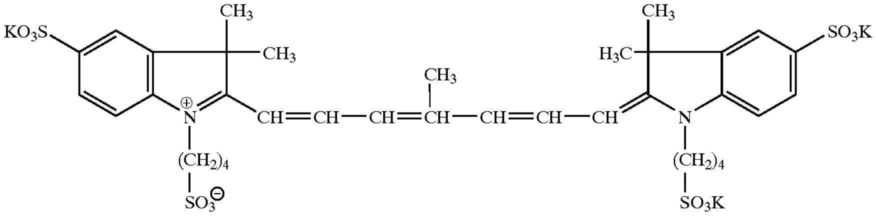
(IR-6)
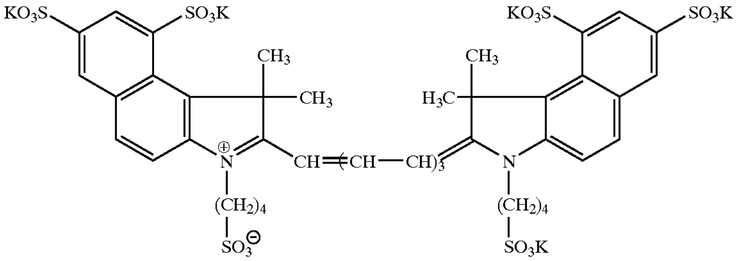
(IR-7)
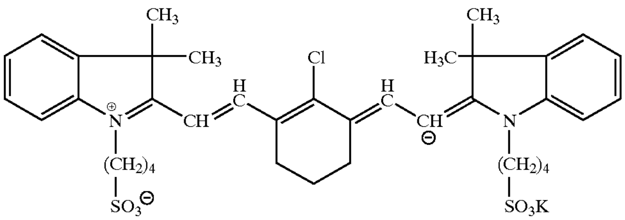
(IR-8)
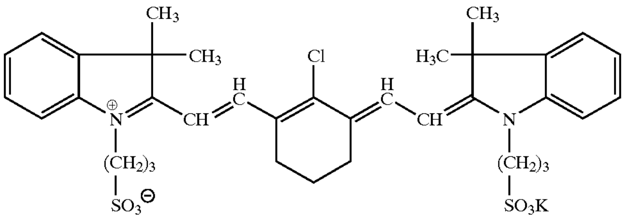
(IR-9)
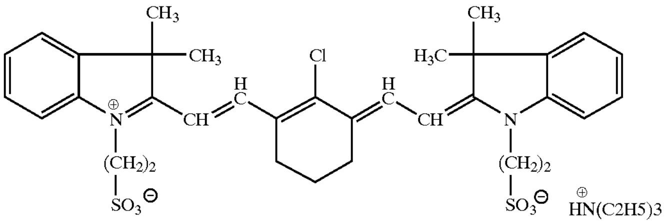
(IR-10)
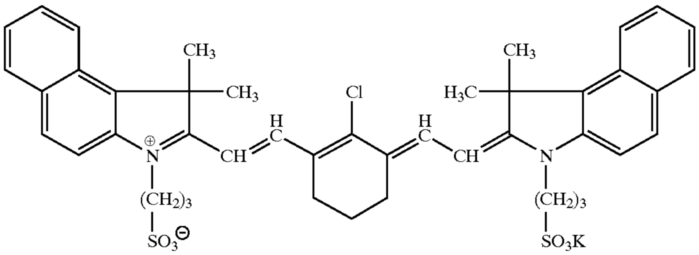

-continued
(IR-11)
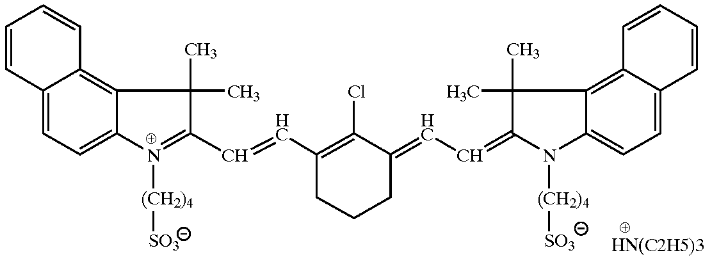
The dyes used in the ink-receptive layer of the present invention may be the infrared absorbing dyes as described above, but more oleophilic dyes are preferred for them. Examples of dyes preferred in particular include the cyanine dyes illustrated below.
(IR-21)
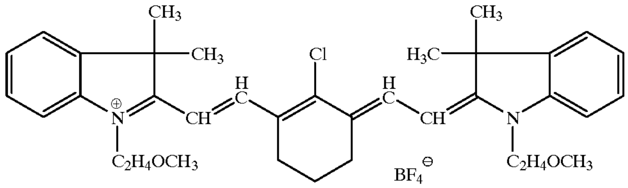
(IR-22)
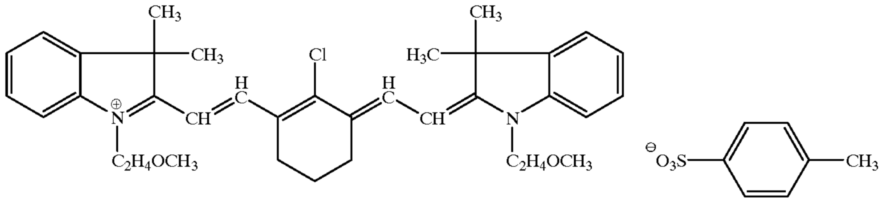
(IR-23)
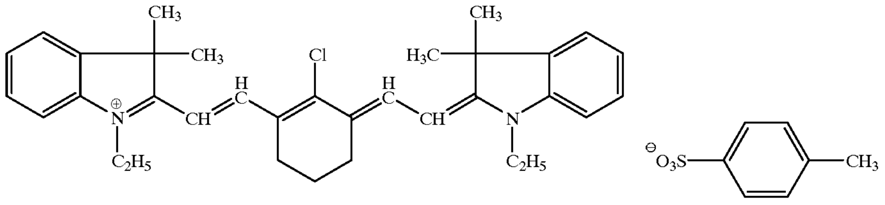
(IR-24)
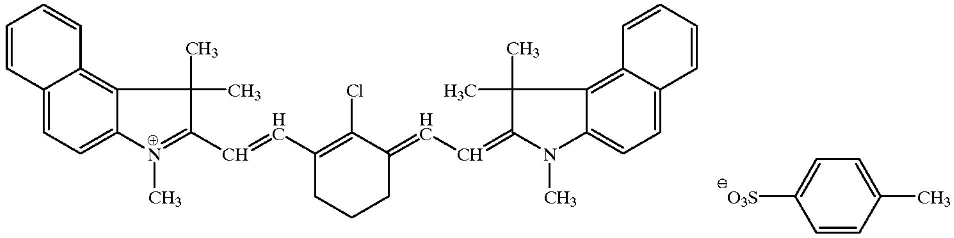

-continued (IR-25)

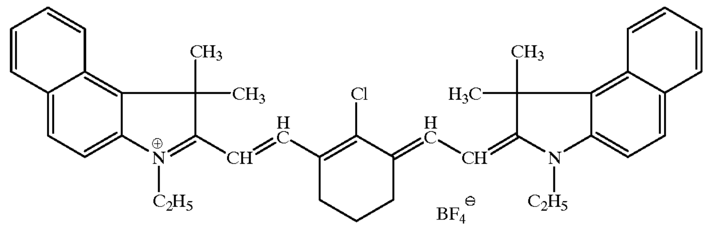

When the compound capable of converting light to heat is added to the water-receptive layer, the suitable proportion thereof is from 1 to 50 weight %, preferably from 2 to 20 weight %, to the total solid components of colloids and hydrophilic resins in the water-receptive layer. The addition of the compound capable of converting light to heat in an amount below the foregoing range cannot provide high sensitivity, while the addition thereof in an amount beyond the foregoing range brings about a drop in water receptivity and deterioration in film strength of the layer. When the compound capable of converting light to heat is added to the overcoat layer, the suitable proportion of the compound capable of converting light to heat is from 1 to 70 weight %, preferably from 2 to 50 weight %, to the total solid components. In particular, the proportion ranging from 2 to 30 weight % is effective when the compound capable of converting light to heat is a dye, while the proportion ranging from 20 to 50 weight % is effective when the compound capable of converting light to heat is a pigment. When the proportion of the compound capable of converting light to heat is below the aforesaid range, the sensitivity becomes low; while it is beyond the aforesaid range, the uniformity of the layer is lost and the film strength of the layer is lowered. The suitable proportion of the compound capable of converting light to heat added to the ink-receptive layer is from 20 weight % or less, preferably 15 weight % or less, to the total solid components in the ink-receptive layer. When the proportion of the compound capable of converting light to heat added is greater than the foregoing upper limit, the film strength of the layer is decreased.

In the case where the compound capable of converting light to heat is added to the overcoat layer, the amounts of compound capable of converting light to heat added to the ink-receptive layer and the water-receptive layer respectively can be reduced depending on the amount added to the overcoat layer, or can be made zero.

In the heat-sensitive lithographic printing plate precursor of the present invention, images are formed by the action of heat. More specifically, the image formation can be performed by direct image-drawing with a heat-recording head, scanning exposure with an infrared laser, high illumination intensity flash exposure with xenon discharge lamps, or exposure with an infrared lamp. In particular, the exposure with semiconductor laser emitting infrared radiation of wavelengths of 700 to 1200 nm or high-output solid-state infrared laser, such as YAG laser, can be preferably used.

The printing plate precursor exposed imagewise of the present invention can be mounted in a printing machine (i.e., a printing press) without undergoing any further processing. Soon after the start of printing operations with ink and a fountain solution, the overcoat layer is removed by the fountain solution and, at the same time, the exposed areas of the water-receptive layer are also removed. As a result, the ink-receptive layer is bared in the part underneath the areas removed, and the bared part undergoes inking. Thus, printing is commenced.

EXAMPLES

Now, the present invention will be illustrated in more detail by reference to the following examples, but these examples should not be construed as limiting the scope of the present invention in any way.

Examples 1 to 2 and Comparative Example 1

Coating of Ink-receptive Layer

On an aluminum plate (quality: JISA1050, thickness: 0.24 mm) which had undergone graining, anodic oxidation and sodium silicate solution treatments by the use of well-known methods, a coating composition containing 3 g of an N-(p-amino-sulfonylphenyl)methacrylamide/ethyl methacrylate/acrylonitrile (32/43/25 by mole) copolymer synthesized using the method disclosed in JP-A-11-44956, 9.5 g of γ-butyrolactone, 3 g of methyl lactate, 22.5 g of methyl ethyl ketone and 22 g of propylene glycol monomethyl ether was coated by means of a bar coater at a solution coverage of 12 ml/$m^2$. Then, the coating composition on the aluminum plate was dried by heating at 100° C. for 1 minute to form an ink-receptive layer having a dry coverage of about 0.5 g/$m^2$.

Coating of Water-receptive Layer

To the thus formed ink-receptive layer, the following coating solution A for a water-receptive layer was applied, and dried at 100° C. for 1 minute to prepare a half-finished article provided with a water-receptive layer having a dry coverage of 1 g/$m^2$. In the coating solution A, the amount level of methyl lactate added was changed in three levels. Specifically, the amount x was 0 g in Comparative Example 1, 1.5 g in Example 1, and 2.0 in Example 2.

| | |
|---|---|
| (Coating Solution A for Water-receptive Layer) 10 wt % Methanol solution of poly (2-hydroxyethyl) methacrylate (weight average molecular weight: 3.0 × $10^5$) | 1 g |
| Methanol silica (colloid as a 30 wt % methanol suspension of silica particles having 10 to 20 nm in size, produced by Nissan Chemicals Industries, Ltd.) | 3 g |
| Methyl lactate | x g |
| Methanol | (16-x) g |

Coating of Overcoat Layer

On each of the thus obtained water-receptive layers, the following coating composition OC-1 for overcoat layer was coated, and dried at 100° C. for 90 seconds. Thus, heat-sensitive lithographic printing plate precursors provided with the overcoat layer having a dry coverage of 0.5 g/$m^2$ were produced.

| | |
|---|---|
| (Coating Composition OC-1 for Overcoat layer) Polyacrylic acid (weight average molecular weight: 50,000) | 1.0 g |
| Infrared absorbing dye (IR-11) illustrated in the specification | 0.2 g |
| Polyoxyethylene nonyl phenyl ether | 0.04 g |
| Water | 19 g |

Plate-making and Printing

Each of the lithographic printing plate precursors thus obtained was mounted in a plate setter equipped with a 830-nm semiconductor laser device of 40 watts, Trend Setter (trade name, made by CREO Co., Ltd.) , and exposed to the laser beams under a condition that the amount of energy applied thereto was adjusted to 300 $mJ/CM^2$. The exposed plate was mounted in a printing machine, Sprint printing machine made by Komori Corporation, as it underwent no further processing, and subjected to printing operations using a fountain solution and commercially available printing ink. The fountain solution used therein was a 1:99:10 by volume mixture of plate etch EU-3, water and isopropyl alcohol. As a result, 10,000 sheets of stain-free, good-quality printed matter were obtained in Example 1 (wherein 1.5 g of methyl acetate was used), and 15,000 sheets of stain-free, good-quality printed matter were obtained in Example 2 (wherein 2.0 g of methyl lactate was used).

In Comparative Example 1 (wherein no methyl lactate was used), on the other hand, the printing plate was worn away in the non-image area and thereby background stain was generated after providing about 2,000 sheets of printed matter.

Example 3 and Comparative Example 2

A heat-sensitive lithographic printing plate precursor (Example 3) was produced in the same manner as in Example 1, except that the Coating Solution A for water-receptive layer was replaced by the following Coating Solution B for water-receptive layer.

| | |
|---|---|
| (Coating Solution B for Water-receptive Layer) 10 wt % Methanol solution of 2-hydroxyethyl methacrylate/acrylic acid (9/1 by weight) copolymer (weight average molecular weight: $3.0 \times 10^5$) | 1 g |
| Glassca 401 (i.e., “Ceramica G-401”: 20 wt % methanol colloidal solution of $ZrO_2.SiO_2$, made by Nichiban Kenkyusho) | 4.5 g |
| Ethylene glycol monomethyl ether | 1 g |
| Methanol | 14.5 g |

The heat-sensitive lithographic printing plate precursor thus obtained was exposed in the same manner as in Example 1, mounted in the same printing machine as used in Example 1, and subjected to the same printing operations as in Example 1. As a result, 10,000 sheets of stain-free, good-quality printed matter were obtained.

Further, a heat-sensitive lithographic printing plate precursor (Comparative Example 2) was produced in the same manner as in Example 3, except that the ethylene glycol monomethyl ether in the Coating Solution B for water-receptive layer was replaced by methanol. In the case of this printing plate precursor, background stain was generated after about 2,000 sheets of printed matter were obtained.

Example 4

A heat-sensitive lithographic printing plate precursor was produced by coating the following Coating Solution C for water-receptive layer on the same ink-receptive layer-provided aluminum support as prepared in Example 1 at a dry coverage of about 1.5 $g/m^2$.

| | |
|---|---|
| (Coating Solution C for Water-receptive Layer) Methanol silica (the same as used in Example 1) | 4.5 g |
| Methanol solution of poly (2-hydroxyethyl) methacrylate (the same as used in Example 1) | 1.5 g |
| Cyanine dye (IR-11) illustrated in the specification | 0.08 g |
| Methyl lactate | 2 g |
| Methanol | 14 g |

The printing plate presursor thus produced was exposed by means of the same plate setter as used in Example 1 under a condition that the amount of energy applied thereto was adjusted to 450 $mJ/cm^2$. Then, the printing was carried out under the same printing conditions as in Example 1, and 25,000 sheets of good-quality printed matter were obtained.

Examples 5 to 9

On the same surface-treated aluminum plate as used in Example 1, an ink-receptive layer was provided using the following Coating Solution II for ink-receptive layer instead of the ink-receptive layer of Example 1. The Coating Solution II was coated by means of a bar coater at a solution coverage of 24 $ml/m^2$, and dried by heating at 100° C. for 1 minute. The dry coverage of the ink-receptive layer thus formed was about 1 $g/m^2$.

| | |
|---|---|
| (Coating Solution II for Ink-receptive Layer) Oleophilic high molecular compound | 3.0 g |
| Fluorine-based surfactant (Megafac F-177, trade name, a product of Dai-Nippon Ink & Chemicals, Inc.) | 0.04 g |
| Methyl ethyl ketone | 37 g |
| Propylene glycol monomethyl ether | 20 g |

The oleophilic high molecular compound used in the foregoing solution was a phenoxy resin (Phenototo YP-50, trade name, a product of Toto Kasei K. K.) in Example 5, a polyvinyl formal resin (Denkaformal #200, trade name, a product of Electro Chemical Industry Co., Ltd.) in Example 6, a polyurethane resin (Estane #5715, trade name, Monsanto Co., Ltd.) in Example 7, a saturated copolyester resin (Chemit K-1294, trade name, a product of Toray Industries, Inc.) in Example 8, and a methyl methacrylate/methacryloyloxypropyltriethoxysilane (60/40 by weight) copolymer (weight average molecular weight: 85,000) in Example 9.

Then, each of these ink-receptive layers was coated with the same Coating Solution C for water-receptive layer as used for forming the water-receptive layer in Example 4, and further thereon was coated the following Coating Solution OC-2 for overcoat layer so as to form an overcoat layer having a dry coverage of about 0.6 $g/m^2$. Thus, heat-sensitive lithographic printing plate precursors were produced.

| | |
|---|---|
| (Coating Solution OC-2 for Overcoat Layer) Polyacrylic acid (weight average molecular weight: 25,000) | 1.0 g |
| Polyoxyethylene nonyl phenyl ether | 0.025 g |
| Water | 19 g |

Each of the thus produced 5 kinks of lithographic printing plate precursors was exposed by means of Trend Setter under a condition that the amount of energy applied thereto was adjusted to 450 mJ/$cm^2$. Then, the printing plates thus made were each subjected to printing operations under the same conditions as in Example 1. As a result, every plate provided 25,000 sheets of good-quality printed matter.

Example 10

A heat-sensitive lithographic printing plate precursor was produced in the same manner as in Example 1, except that the surface-treated aluminum plate of Example 1 was replaced by a 0.2 mm-thick polyethylene terephthalate film. This printing plate presursor was exposed in the same manner as in Example 1, mounted in Sprint printing machine, and then subjected to the same printing operations as in Example 1. As a result, 10,000 sheets of stain-free, good-quality printed matter were obtained.

Example 11

The following Coating Solution D for water-receptive layer, wherein a cross-linking agent for colloid was contained as an additive, was coated on the same ink-receptive layer as provided on the aluminum plate (or sheet) in Example 1, and dried at 100° C. for 1 minute to form a cross-linked water-receptive layer having a dry coverage of about 1 g/$m^2$.

| | |
|---|---|
| (Coating Solution D for Water-receptive Layer) 10 wt % Methanol solution of poly (2-hydroxyethyl) methacrylate (the same as used in Example 1) | 1 g |
| 30% Methanol solution of methanol silica (the same as used in Example 1) | 3 g |
| Aminopropyltriethoxysilane | 0.05 g |
| Methyl lactate | 2 g |
| Methanol | 14 g |

On the water-receptive layer thus formed, the Coating Solution OC-1 for overcoat layer was further coated so as to have a dry coverage of 0.5 g/$m^2$ to produce a heat-sensitive lithographic printing plate precursor.

The thus produced printing plate presursor was subjected to exposure and then printing operations under the same conditions as in Example 1. As a result, 20,000 sheets of stain-free, good-quality printed matter were obtained.

Example 12

A substrate having an ink-receptive layer (dry coverage: 0.5 g/$m^2$) was prepared in the same manner as in Example 1, except that the coating solution used for forming the ink-receptive layer in Example 1 was changed so as to have the formulation containing an additional ingredient, a cyanine dye as the compound capable of converting light to heat (the following Coating Solution III).

| | |
|---|---|
| (Coating Solution III for Ink-receptive Layer) N-(p-Aminosulfonylphenyl)methacrylamide copolymer | 3 g |
| Dye (IR-24) illustrated in the specification | 0.3 g |
| γ-Butyrolactone | 9.5 g |
| Methyl lactone | 3 g |
| Methyl ethyl ketone | 22.5 g |
| Propylene glycol monomethyl ether | 22 g |

This substrate was coated with the same water-receptive layer as in Example 1 and then the overcoat layer according to the OC-2 formulation to form a heat-sensitive printing plate precursor. The printing plate presursor thus obtained was exposed by means of Trend Setter under a condition that the amount of energy applied thereto was adjusted to 400 mJ/$cm^2$, and then subjected to printing operations using Sprint printing machine under the same condition as in Example 1. As a result, 10,000 sheets of stain-free, good-quality printed matter were obtained.

EFFECT OF THE INVENTION

A heat-sensitive lithographic printing plate precursor according to the present invention can be mounted in a printing press (i.e., a printing machine) without undergoing development-processing and subjected directly to printing operations, and the printing plate made therefrom can have excellent impression capacity and high resistance to printing stain.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate precursor having on a support (1) an ink-receptive layer comprising an oleophilic organic high molecular compound, (2) a water-receptive layer easily allowing removal by a fountain solution or a printing ink when heated, which are arranged in this order and (3) an overcoat layer on the water-receptive layer wherein the overcoat layer contains a compound capable of converting light to heat: said water-receptive layer being a layer formed using a coating solution comprising a solvent capable of dissolving the organic high molecular compound of the ink-receptive layer in a proportion of 1 to 40 weight % of the total solvents in the coating solution.

2. The heat-sensitive lithographic printing plate precursor as in claim 1, wherein the water-receptive layer comprises a hydrophilic resin and a colloid of oxide or hydroxide of at least one element selected from the group consisting of beryllium, magnesium, aluminum, silicon, titanium, boron, germanium, tin, zirconium, iron, vanadium, antimony and transition metals.

3. The heat-sensitive lithographic printing plate precursor as in claim 2, wherein the hydrophilic resin is contained in a proportion of 0. 1 to 30 weight % to the total solid components in the water-receptive layer.

4. The heat-sensitive lithographic priming plate precursor as in claim 2, wherein the hydrophilic resin is a hydroxyalkyl acrylate homopolymer, a hydroxyalkyl acrylate copolymer, a hydroxyalkyl methacrylate homopolymer or a hydroxyalkyl methacrylate copolymer.

5. The heat-sensitive lithographic printing plate precursor as in claim 2, wherein the water-receptive layer does not contain a cross-linking agent and the hydrophilic resin is not cross-linked.

6. The heat-sensitive lithographic printing plate precursor as in claim 1, wherein the water-receptive layer has a thickness of from 0.1 μm to 3 μm.

7. The heat-sensitive lithographic printing plate precursor as in claim 1, wherein the solvent capable of dissolving the organic high molecular component is selected from the group consisting of alcohols, ethers, ketones, esters, amides, γ-butyrolactone, methyl lactone and ethyl lactone.

8. The heat-sensitive lithographic printing plate precursor as in claim 1, wherein the water-receptive layer containing solution contains a mixture of solvents including alcohol as a main solvent and the solvent capable of dissolving the organic high molecular compound of the ink-receptive layer.

9. The heat-sensitive lithographic printing plate precursor as in claim 1, wherein the overcoat layer is water-soluble overcoat layer which is removed upon printing.

10. A heat-sensitive lithographic printing plate precursor having on a support (1) an ink-receptive layer comprising an oleophilic organic high molecular compound, and (2) a water-receptive layer easily allowing removal by a fountain solution or a printing ink when heated wherein the water-receptive layer comprises a hydrophilic resin and a colloid of oxide or hydroxide of at least one element selected from the group consisting of beryllium, magnesium, aluminum, silicon, titanium, boron, germanium, tin, zirconium, iron, vanadium, antimony and transition metals, and wherein the water-receptive layer does not contain a cross-linking agent and the hydrophilic resin is not cross-linked, the ink-receptive layer and the water-receptive layer being arranged in this order: said water-receptive layer being a layer formed using a coating solution comprising a solvent capable of dissolving the organic high molecular compound of the ink-receptive layer in a proportion of 1 to 40 weight % of the total solvents in the coating solution.

11. The heat-sensitive lithographic printing plate precursor as in claim 10, wherein the hydrophilic resin is contained in a proportion of 0.1 to 30 weight % to the total solid components in the water-receptive layer.

12. The heat-sensitive lithographic printing plate precursor as in claim 10, wherein the hydrophilic resin is a hydroxyalkyl acrylate homopolymer, a hydroxyalkyl acrylate copolymer, a hydroxyalkyl methacrylate homopolymer or a hydroxyalkyl methacrylate copolymer.

13. The heat-sensitive lithographic printing plate precursor as in claim 10, wherein the water-receptive layer has a thickness of from 0.1 $\mu$m to 3 $\mu$m.

14. The heat-sensitive lithographic printing plate precursor as in claim 10, wherein the solvent capable of dissolving the organic high molecular component is selected from the group consisting of alcohols, ethers, ketones, esters, aniides, γ-butyrolactone, methyl lactone and ethyl lactone.

15. The heat-sensitive lithographic printing plate precursor as in claim 10, wherein the water-receptive layer containing solution contains a mixture of solvents including alcohol as a main solvent and the solvent capable of dissolving the organic high molecular compound of the ink-receptive layer.

16. The heat-sensitive lithographic printing plate precursor as in claim 10, wherein the heat-sensitive lithographic printing plate precursor has an overcoat layer on the water-receptive layer.

17. The heat-sensitive lithographic printing plate precursor as in claim 16, wherein the overcoat layer is water-soluble overcoat layer which is removed upon printing.

18. The heat-sensitive lithographic printing plate precursor as in claim 16, wherein the overcoat layer contains a compound capable of converting light to heat.

* * * * *